(12) United States Patent
Nabe et al.

(10) Patent No.: US 11,676,977 B2
(45) Date of Patent: *Jun. 13, 2023

(54) SEMICONDUCTOR DEVICE

(71) Applicant: Sony Group Corporation, Tokyo (JP)

(72) Inventors: Yoshihiro Nabe, Tokyo (JP); Hiroshi Asami, Shizuoka (JP); Yuji Takaoka, Kanagawa (JP); Yoshimichi Harada, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/712,889

(22) Filed: Apr. 4, 2022

(65) Prior Publication Data

US 2022/0231061 A1 Jul. 21, 2022

Related U.S. Application Data

(60) Continuation of application No. 16/055,442, filed on Aug. 6, 2018, now Pat. No. 11,315,970, which is a
(Continued)

(30) Foreign Application Priority Data

Mar. 15, 2007 (JP) ................ 2007-066173

(51) Int. Cl.
*H01L 27/146* (2006.01)
*H01L 23/48* (2006.01)
(Continued)

(52) U.S. Cl.
CPC .. *H01L 27/14618* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS

| 6,013,948 A | 1/2000 | Akram et al. |
| 6,235,554 B1 | 5/2001 | Akram et al. |

(Continued)

FOREIGN PATENT DOCUMENTS

| JP | H 10-303198 | 11/1998 |
| JP | 2002-217197 | 8/2002 |

(Continued)

OTHER PUBLICATIONS

Official Action for Japan Patent Application No. 2007-066173, dated Dec. 24, 2008, 2 pages.
(Continued)

*Primary Examiner* — Telly D Green
(74) *Attorney, Agent, or Firm* — Sheridan Ross P.C.

(57) ABSTRACT

A semiconductor device including a semiconductor substrate having oppositely facing first and second surfaces, the first surface being an active surface and provided with an electronic element thereon, a pad electrode to be connected to the electronic element in a peripheral portion of the electronic element on the active surface, a first opening extending from the second surface toward the pad electrode so as not to reach the first surface of the semiconductor substrate, a second opening formed to reach the pad electrode from a bottom surface of the first opening and having a diameter smaller than that of the first opening, an insulating layer formed to cover sidewall surfaces of the first opening and the second opening, and a conductive layer formed, inside of the insulating layer, to cover at least an inner wall surface of the insulating layer and a bottom surface of the second opening.

20 Claims, 10 Drawing Sheets

Related U.S. Application Data continuation of application No. 15/167,348, filed on May 27, 2016, now Pat. No. 10,050,074, which is a continuation of application No. 14/689,906, filed on Apr. 17, 2015, now Pat. No. 9,379,155, which is a continuation of application No. 14/199,124, filed on Mar. 6, 2014, now Pat. No. 9,041,179, which is a continuation of application No. 13/553,389, filed on Jul. 19, 2012, now abandoned, which is a division of application No. 12/046,637, filed on Mar. 12, 2008, now Pat. No. 8,252,628.

(51) Int. Cl.
  *H01L 23/00* (2006.01)
  *H01L 21/768* (2006.01)
  *H01L 31/0224* (2006.01)

(52) U.S. Cl.
  CPC .............. *H01L 24/05* (2013.01); *H01L 24/16* (2013.01); *H01L 27/14634* (2013.01); *H01L 27/14636* (2013.01); *H01L 31/0224* (2013.01); *H01L 24/13* (2013.01); *H01L 2224/02372* (2013.01); *H01L 2224/02377* (2013.01); *H01L 2224/0401* (2013.01); *H01L 2224/05548* (2013.01); *H01L 2224/05567* (2013.01); *H01L 2224/05647* (2013.01); *H01L 2224/1134* (2013.01); *H01L 2224/131* (2013.01); *H01L 2224/13022* (2013.01); *H01L 2224/13024* (2013.01); *H01L 2224/13144* (2013.01); *H01L 2224/16238* (2013.01); *H01L 2924/0002* (2013.01); *H01L 2924/00014* (2013.01); *H01L 2924/01078* (2013.01); *H01L 2924/01079* (2013.01); *H01L 2924/12042* (2013.01); *H01L 2924/30105* (2013.01); *H01L 2924/351* (2013.01)

(56) References Cited

U.S. PATENT DOCUMENTS

| | | |
|---|---|---|
| 7,109,068 B2 | 9/2006 | Akram et al. |
| 8,252,628 B2 | 8/2012 | Nabe et al. |
| 9,041,169 B2 | 5/2015 | Koshikawa et al. |
| 9,041,179 B2 | 5/2015 | Nabe et al. |
| 9,379,155 B2 | 6/2016 | Nabe et al. |
| 10,050,074 B2 | 8/2018 | Nabe et al. |
| 11,315,970 B2 * | 4/2022 | Nabe .............. H01L 24/16 |
| 2004/0155354 A1 | 8/2004 | Hanaoka et al. |
| 2005/0056903 A1 | 3/2005 | Yamamoto et al. |
| 2006/0022290 A1 | 2/2006 | Chen et al. |
| 2006/0043510 A1 | 3/2006 | Yamazaki et al. |
| 2006/0046463 A1 | 3/2006 | Watkins et al. |
| 2006/0079040 A1 | 4/2006 | Tanaka et al. |
| 2006/0180933 A1 | 8/2006 | Kanamori et al. |
| 2006/0202615 A1 | 9/2006 | Murakami et al. |
| 2006/0267202 A1 | 11/2006 | Matsuzaki |
| 2007/0095471 A1 | 5/2007 | Ito et al. |
| 2007/0126128 A1 | 6/2007 | Jobetto et al. |
| 2007/0262464 A1 | 11/2007 | Watkins et al. |
| 2008/0001156 A1 | 1/2008 | Sakakura et al. |
| 2008/0042926 A1 | 2/2008 | Egi et al. |
| 2008/0129933 A1 | 6/2008 | Nishida et al. |
| 2008/0130122 A1 | 6/2008 | Egi et al. |
| 2008/0158682 A1 | 7/2008 | Egi et al. |
| 2008/0230178 A1 | 9/2008 | Ishitani et al. |
| 2008/0230179 A1 | 9/2008 | Ishitani et al. |
| 2008/0246136 A1 | 10/2008 | Haba et al. |
| 2008/0284041 A1 | 11/2008 | Jang et al. |
| 2009/0302481 A1 | 12/2009 | Matsuzaki |
| 2011/0073861 A1 | 3/2011 | Yamada et al. |
| 2012/0286387 A1 | 11/2012 | Nabe et al. |
| 2019/0043905 A1 | 2/2019 | Nabe et al. |

FOREIGN PATENT DOCUMENTS

| | | |
|---|---|---|
| JP | 2004-014657 | 1/2004 |
| JP | 2005-235858 | 9/2005 |
| JP | 2005-294582 | 10/2005 |
| JP | 2006-128713 | 5/2006 |
| JP | 2006-237594 | 9/2006 |
| KR | 10-2006-0115986 | 11/2013 |

OTHER PUBLICATIONS

Official Action for Japan Patent Application No. 2007-294582, dated Mar. 17, 2009, 3 pages.
Official Action (with English translation) for Korea Patent Application No. 10-2008-0009042, dated Feb. 13, 2014, 9 pages.
Official Action for U.S. Appl. No. 12/046,637, dated Oct. 7, 2010, 5 pages. Restriction Requirement.
Official Action for U.S. Appl. No. 12/046,637, dated Jan. 13, 2011, 8 pages.
Official Action for U.S. Appl. No. 12/046,637, dated Sep. 22, 2011, 8 pages.
Official Action for U.S. Appl. No. 12/046,637, dated Jan. 11, 2012, 9 pages.
Notice of Allowance for U.S. Appl. No. 12/046,637, dated Apr. 30, 2012, 7 pages.
Official Action for U.S. Appl. No. 13/553,389, dated Jun. 9, 2012, 7 pages.
Official Action for U.S. Appl. No. 13/553,389, dated Apr. 1, 2013, 8 pages.
Official Action for U.S. Appl. No. 13/553,389, dated Sep. 6, 2013, 7 pages.
Official Action for U.S. Appl. No. 14/199,124, dated Apr. 21, 2014, 8 pages.
Official Action for U.S. Appl. No. 14/199,124, dated Sep. 29, 2014, 8 pages.
Notice of Allowance for U.S. Appl. No. 14/199,124, dated Jan. 21, 2015, 8 pages.
Official Action for U.S. Appl. No. 14/689,906, dated Jun. 22, 2015, 10 pages.
Official Action for U.S. Appl. No. 14/689,906, dated Oct. 26, 2015, 7 pages.
Notice of Allowance U.S. Appl. No. 14/689,906, dated Feb. 29, 2016, 7 pages.
Official Action for U.S. Appl. No. 15/1673478, dated Aug. 26, 2016, 12 pages.
Official Action for U.S. Appl. No. 15/1673478, dated Feb. 14, 2017, 9 pages.
Official Action for U.S. Appl. No. 15/1673478, dated Jul. 5, 2017, 12 pages.
Official Action for U.S. Appl. No. 15/1673478, dated Oct. 20, 2017, 10 pages.
Notice of Allowance for U.S. Appl. No. 15/1673478, dated Apr. 11, 2018, 7 pages.
Official Action for U.S. Appl. No. 16/055,442, dated Aug. 16, 2019, 11 pages.
Official Action for U.S. Appl. No. 16/055,442, dated Jan. 17, 2020, 15 pages.
Official Action for U.S. Appl. No. 16/055,442, dated Apr. 20, 2020, 25 pages.
Official Action for U.S. Appl. No. 16/055,442, dated Aug. 31, 2020, 26 pages.
Official Action for U.S. Appl. No. 16/055,442, dated Jan. 19, 2021, 28 pages.
Official Action for U.S. Appl. No. 16/055,442, dated Jun. 1, 2021, 18 pages.

(56) References Cited

OTHER PUBLICATIONS

Official Action for U.S. Appl. No. 16/055,442, dated Aug. 9, 2021, 16 pages.
Notice of Allowance for U.S. Appl. No. 16/055,442, dated Jan. 3, 2022, 7 pages.
Notice of Allowance for U.S. Appl. No. 16/055,442, dated Jan. 7, 2022, 4 pages.

* cited by examiner

SEMICONDUCTOR DEVICE

CROSS REFERENCE TO RELATED APPLICATIONS

This application is a continuation of U.S. patent application Ser. No. 16/055,442, filed Aug. 6, 2018, which is a continuation of U.S. patent application Ser. No. 15/167,348, filed May 27, 2016, now U.S. Pat. No. 10,050,074, which is a continuation of U.S. patent application Ser. No. 14/689,906 filed Apr. 17, 2015, now U.S. Pat. No. 9,379,155, which is a continuation of U.S. patent application Ser. No. 14/199,124 filed Mar. 6, 2014, now U.S. Pat. No. 9,041,179, which is a continuation of U.S. patent application Ser. No. 13/553,389 filed Jul. 19, 2012, which is a division of U.S. patent application Ser. No. 12/046,637 filed on Mar. 12, 2008, now U.S. Pat. No. 8,252,628, the entireties of which are incorporated herein by reference to the extent permitted by law. The present invention claims priority to and contains subject matter related to Japanese Patent Application No. JP 2007-066173 filed in the Japanese Patent Office on Mar. 15, 2007, the entire contents of which being incorporated herein by reference.

BACKGROUND OF THE INVENTION

1. Field of the Invention

The present invention relates to a semiconductor device and a method of manufacturing the same. More particularly, the present invention relates to a semiconductor device having a wiring which passes through a substrate such as a semiconductor device in a packaged form in which a solid-state imaging device or the like is air-tightly sealed. The present invention relates also to a method of manufacturing the same.

2. Description of Related Art

As one example of miniaturization of a solid-state image sensor, there is disclosed a method for keeping a image sensor area in a sealed state in Japanese Unexamined Patent Application Publication No. 2006-128713 (hereinafter referred to as "Patent Document 1") or the like. The method includes forming an adhesive layer in a peripheral portion, outside of the image sensor area, disposing a transparent plate such as glass above the solid-state image sensor to adhere the transparent plate by an adhesive layer for sealing.

A method for electrically connecting an external electrode of the solid-state image sensor thus configured is as follows: a dry etching method or the like is used to form a through hole which reaches a pad electrode made of aluminum or the like disposed on an active surface from a surface opposite to the active surface of the solid-state image sensor; an inner wall of the through hole is formed with an insulating layer for ensuring insulation from a silicon substrate constituting the solid-state image sensor; and a conductive layer, made of copper or the like, for electrically connecting with the pad electrode filled within the through hole or deposited to cover a side wall of the through hole.

When the external electrode is electrically connected from a rear surface of the active surface, it may become possible to achieve packaging of a solid-state imaging device by the same size as that of the solid-state image sensor, thereby enabling miniaturization of the solid-state imaging device.

SUMMARY OF THE INVENTION

However, in the semiconductor device of the Patent Document 1, the silicon substrate and the conductive layer filled within the through hole or deposited to cover the side wall of the through hole have a difference in thermal expansion coefficient. Thus, there arises an issue in that due to a thermal process such as that for solidification of a resin applied after the formation of the conductive layer, a reflow of a solder or the like, crack occurs on a silicon substrate side from a bottom which reaches the pad electrode of the through hole and an area near a corner of the side wall.

Further, there is another issue in that due to thermal expansion resulting from the thermal process of the conductive layer, the aluminum or the like of the pad electrode is pushed upwardly, thereby causing peeling on an interface between the conductive layer and the pad electrode, or peeling of the pad electrode and the adhesive layer.

An issue to be solved is difficulty in inhibiting the crack or the peeling caused due to a difference in thermal expansion coefficient between the conductive layer filled within the through hole and the substrate or the pad electrode.

In accordance with an aspect of the present invention, there is provided a semiconductor device of including: a semiconductor substrate having first and second surfaces opposite each other, the first surface being an active surface by provided with an electronic element thereon; an active surface formed with an electronic element; a pad electrode formed to be connected to the electronic element in a peripheral portion of the electronic element on the active surface; a first opening extending from the second surface of the semiconductor substrate toward the pad electrode so as not to reach the first surface of the semiconductor substrate; a second opening, formed to reach the pad electrode from a bottom surface of the first opening, having a diameter smaller than that of the first opening; an insulating layer formed to cover sidewall surfaces of the first opening and the second opening; and a conductive layer formed, inside of the insulating layer, to cover at least an inner wall surface of the insulating layer and a bottom surface of the second opening.

In the above-described semiconductor device, the electronic element is formed on the first surface which is the active surface of the semiconductor substrate, and the pad electrode is formed to be connected to the electronic element in the peripheral portion of the electronic element on the active surface. Herein, the first opening extends from the second surface of the semiconductor substrate toward the pad electrode so as not to reach the first surface of the semiconductor substrate, and the second opening, having a diameter smaller than that of the first opening, is formed to reach the pad electrode from the bottom surface of the first opening. The insulating layer is formed to cover sidewall surfaces of the first opening and the second opening. The conductive layer is formed to cover at least the inner wall surface of the insulating layer and the bottom surface of the second opening, inside of the insulating layer.

In accordance with another aspect of the present invention, there is provided a method of manufacturing a semiconductor device including the steps of: providing a semiconductor substrate having first and second surfaces opposite each other; forming an electronic element on the first surface which is an active surface of a semiconductor substrate and forming a pad electrode to be connected to the electronic element in a peripheral portion of the electronic element on the active surface; forming a first opening to extend from the second surface of the semiconductor substrate toward the pad electrode so as not to reach the first surface of the semiconductor substrate; forming a second opening having a diameter smaller than that of the first opening to reach the pad electrode from a bottom surface of the first opening; covering sidewall surfaces of the first opening and the second opening to form an insulating layer; and covering, inside of the insulating layer, at least an inner wall surface of the insulating layer and a bottom surface of the second opening to form a conductive layer.

In the above-described method of manufacturing a semiconductor device, the electronic element is formed on the first surface of the semiconductor substrate, and the pad electrode is formed to be connected to the electronic element in the peripheral portion of the electronic element on the active surface.

Subsequently, the first opening is formed to extend from the second surface of the semiconductor substrate toward the pad electrode so as not to reach the first surface of the semiconductor substrate, and the second opening, having a diameter smaller than that of the first opening, is formed to reach the pad electrode from the bottom surface of the first opening.

Thereafter, the sidewall surfaces of the first opening and the second opening are covered to form the insulating layer, and inside of the insulating layer, at least the inner wall surface of the insulating layer and the bottom surface of the second opening are covered to form the conductive layer.

DETAILED DESCRIPTION OF EMBODIMENTS

With reference to drawings, embodiments of a semiconductor device of the present invention and a method of manufacturing the same will be described.

First Embodiment

Figure 1A:
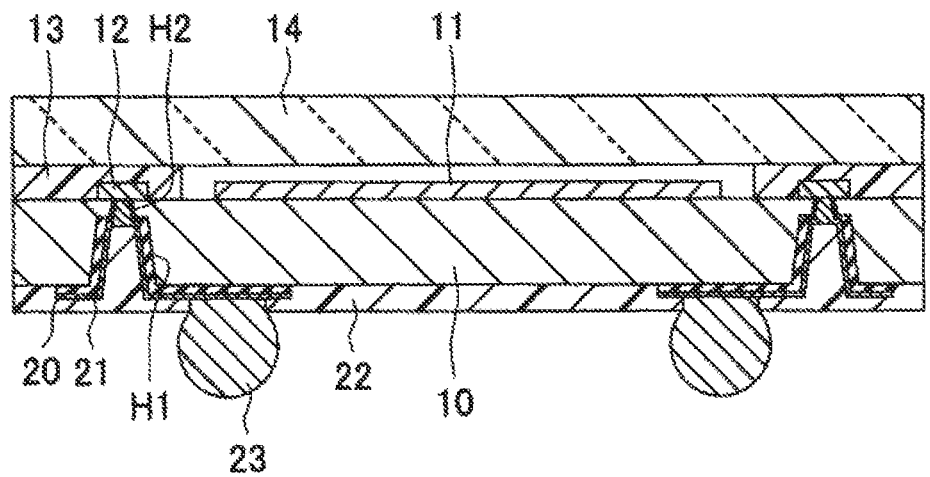
FIG. 1A is a schematic cross-sectional view of a semiconductor device according to a first embodiment of the present invention.
Figure 1B:
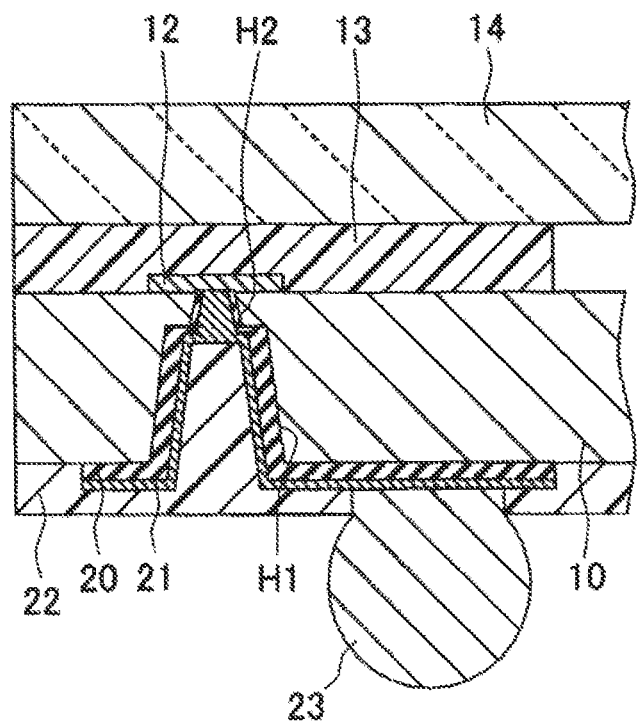
FIG. 1B is an enlarged view of essential parts of FIG. 1A.

FIG. 1A is a schematic cross-sectional view of a semiconductor device according to the embodiment, and FIG. 1B is an enlarged view of essential parts of FIG. 1A.

The semiconductor device according to an embodiment of the present invention is configured such that on a semiconductor chip having a solid-state image sensor such as a CMOS image sensor, the solid-state image sensor is airtightly sealed, whereby a package form is realized.

A semiconductor substrate 10 has a first surface and a second surface opposite each other. For example, on the first surface which is an active surface of a semiconductor substrate 10 formed of silicon, a solid-state image sensor 11 such as a CMOS image sensor is formed.

Further, for example, on the active surface of the semiconductor substrate 10, in a peripheral portion of the solid-state image sensor 11, a pad electrode 12 is formed to be connected with the solid-state image sensor 11.

For example, the second surface which is an opposite to the active surface of the semiconductor substrate 10, a package substrate 14 formed of a transparent substrate such as glass is disposed. In a gap formed between the peripheral portion of the solid-state image sensor 11 on the semiconductor substrate 10 and the package substrate 14, a sealing resin layer 13 is formed, whereby the solid-state image sensor 11 is air-tightly sealed.

For example, a first opening H1 is formed to extend from the second surface of the semiconductor substrate 10 toward the pad electrode 12 so as not to reach the first surface of the semiconductor substrate 10, and a second opening 2, having a diameter smaller than that of the first opening H1, is formed to reach the pad electrode 12 from a bottom surface of the first opening H1.

For example, an insulating layer 20, formed of silicon oxide or the like, is formed to cover sidewall surfaces of the first opening H1 and the second opening H2. Inside of the insulating layer 20, a conductive layer 21, formed of copper or the like, is formed to cover at least an inner wall surface of the insulting layer 20 and a bottom surface of the second opening H2 is formed.

The insulting layer 20 is a layer for avoiding a short-circuit between the semiconductor substrate 10 and the conductive layer 21. The insulating layer 20 and the conductive layer 21 are pulled externally of the opening on the surface on the side opposite to the active surface of the semiconductor substrate 10, and function as lead electrodes.

A passivation film 22, which is a solder resist or the like, is formed to cover the surface on the side opposite to the active surface of the semiconductor substrate 10. An opening for exposing a part of the conductive layer 21 is provided on the passivation film 22, and a bump 23 such as a soldering ball bump and a gold stud bump is formed therein.

As described above, the semiconductor device according to an embodiment of the present invention is configured.

The semiconductor device according to an embodiment of the present invention is used, for example, by being mounted via the bump 23 on a mount substrate or the like, or being mounted in another substrate formed with a memory element or the like to be used in a module.

Figure 2:
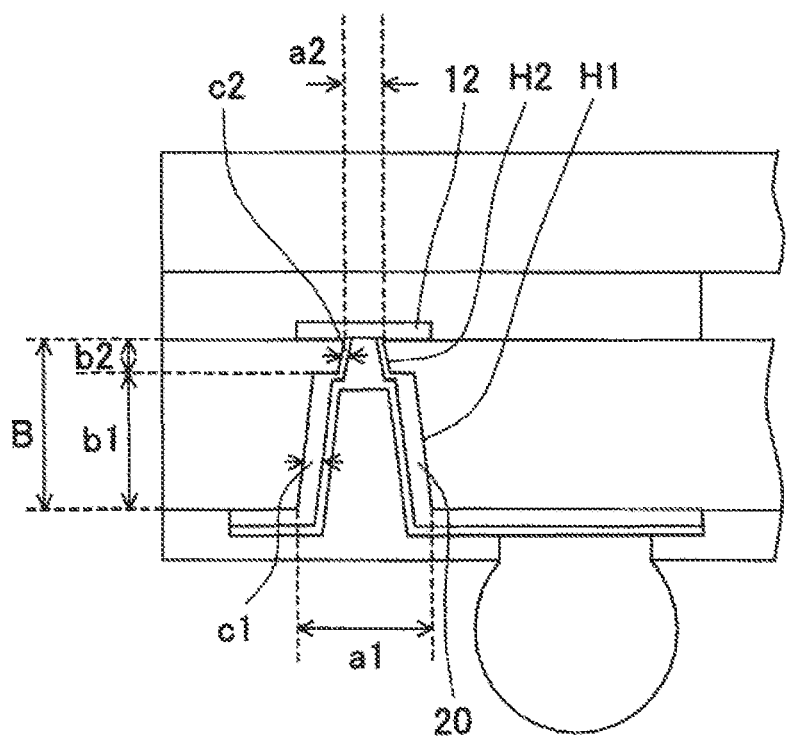
FIG. 2 is a schematic diagram for describing a size of each part of the semiconductor device according to the first embodiment of the present invention.

FIG. 2 is a schematic diagram for describing a size of each part of the semiconductor device according to an embodiment of the present invention.

In the semiconductor device described above, a diameter a2 of the second opening H2 preferably is 0.7 or less times a diameter a1 of the first opening H1, and more preferably 0.5 times or less.

As explained in a manufacturing method described later, it may be possible to increase a degree of freedom of an alignment of the second opening H2 relative to the pad electrode 12.

Further, a depth b1 of the first opening H1 preferably is 0.5 times or more and 0.9 times or less a thickness B of the semiconductor substrate 10.

If the depth b1 of the first opening H1 is less than 0.5 times the thickness B of the semiconductor substrate 10, an aspect ratio of the second opening H2 becomes too large. Thus, it may become difficult to perform opening of the second opening H2, an embedding step in the conductive layer or the like. As a result, there is a possibility that a TAT (Turn Around Time) becomes long. Alternatively, when the depth b1 exceeds 0.9 times, a thickness of the semiconductor substrate 10 in a portion where the second opening H2 is formed becomes too thin. Thus, it may become more probable that a trouble occurs at the time of the formation of the second opening H2 or in a reliability cycle thereafter.

For example, when the semiconductor substrate 10 has a thickness of 200 μm, the first opening H1 has a diameter a1 of 80 μm, the depth b1 is 160 μm, the second opening H2 has a diameter a2 of is 30 μm, and has a depth b2 of 40 μm, a shape of a good through hole may be realized.

Further, in the insulating layer 20, a thickness c1 of a portion which covers the sidewall surface of the first opening H1 preferably is thicker than a thickness c2 of that which covers the sidewall surface of the second opening H2.

When the thickness c1 of the insulting layer in a portion of the first opening H1 having a large diameter is rendered thick and that of the insulting layer 20 in a portion of the second opening H2 is rendered thin, a parasitic capacitance between the conductive layer and the semiconductor substrate 10 is decreased. As a result, it may be possible to achieve a less power consumption of the semiconductor device, and to perform a good embedding in a conductive material in a portion of the second opening H2 having a small diameter.

The insulating layer 20 preferably is formed of one insulating material such as oxide silicon, but may be formed of a plurality of materials.

For example, when a whole of the insulating layer 20 is formed of the oxide silicon, as described in a manufacturing method later, the sidewall surface of the first opening H1 and that of the second opening H2 are covered to form an oxide silicon film, and thereafter, a portion of the sidewall surface of the second opening H2 is removed to render thick the insulating layer of a portion of the first opening H1 while forming the oxide silicon film again in the portion of the sidewall surface of the second opening H2, whereby the thus configured insulating layer may be formed.

In the configuration in which a conductive layer is formed on an inner wall of an opening extending through a substrate, which is an issue in the developing technologies, it is effective to render a diameter of the conductive layer as small as possible to prevent crack or peeling. For example, it may be possible to consider to simply reduce a size of the diameter of the through hole, but in this case, workability of the through hole becomes poor, and thus, it may become very difficult to form an opening which reaches the pad electrode. Further, when the size of the diameter of the through hole is reduced, an embedding performance of a conductor at the time of the formation of the conductive layer becomes poor, and thus, it may become very difficult to form the conductive layer.

It may be considered that the diameter of the through hole is kept the same as in the developing technologies, a thickness of the oxide silicon film formed on the wall surface is rendered thick, and the size of the diameter of the conductive layer is reduced. However, in this case, again, a diameter of a space in which the conductive layer is formed becomes small, and thus, the embedding performance of the conductor becomes poor. As a result, it may become very difficult to form the conductive layer.

According to the semiconductor device of an embodiment of the present invention, a through hole is formed of the first opening and the second opening smaller in diameter than the first opening. Thus, it may prevent crack or peeling occurred due to a difference in thermal expansion coefficient between the conductive layer filled within the through hole and the substrate or the pad electrode.

In addition, a portion small in diameter is the second opening only, and thus, the formation of the through hole is facilitated. Further, the embedding performance of the conductor in the through hole is realized without causing deterioration.

With reference to FIG. 3 to FIG. 8, the method of manufacturing the semiconductor device of the above-described embodiments of the present invention is described.

Figure 3A:
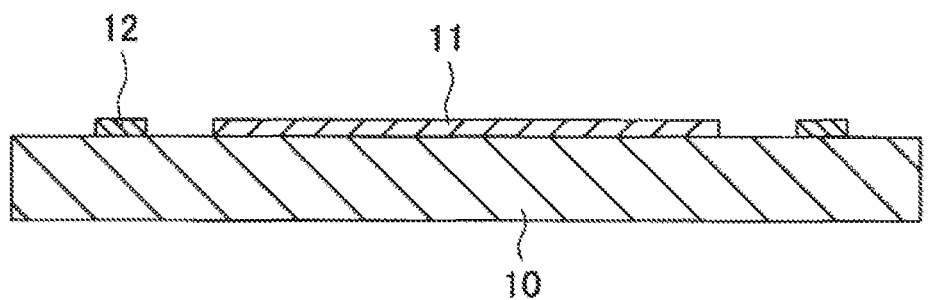
FIGS. 3A and 3B are cross-sectional views each showing a manufacturing step of a method of manufacturing the semiconductor device according to the first embodiment of the present invention.

Firstly, as shown in FIG. 3A, the solid-state image sensor 11 such as a CMOS image sensor is formed on the active surface of the semiconductor substrate 10 formed of silicon or the like, for example, and then the pad electrode 12 is formed to be connected to the solid-state image sensor 11 in a peripheral portion of the solid-state image sensor 11 on the active surface of the semiconductor substrate 10.

Figure 3B:
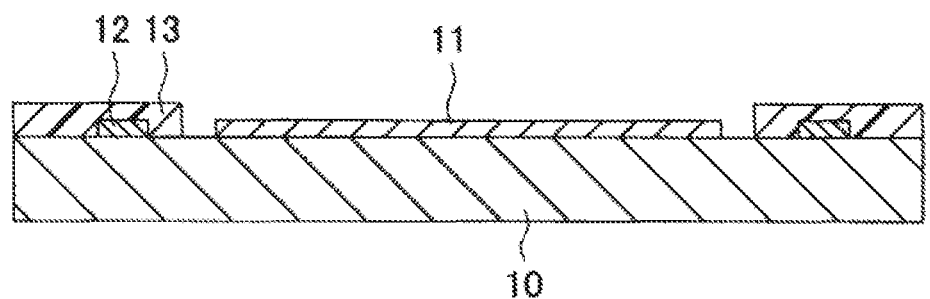

Subsequently, as shown in FIG. 3B, for example, a photosensitive resin layer is coated by a spin coat method or the like, a resin in a region which covers the pad electrode 12 is remained in the peripheral portion of the solid-state image sensor 11 on the semiconductor substrate 10, and exposure and development are performed such that the resin in the region of the solid-state image sensor 11 is removed, whereby the sealing resin layer 13 is formed in the peripheral portion of the solid-state image sensor 11 on the semiconductor substrate 10.

The region covered with the sealing resin layer 13 is pertinent to an adhesion strength with a package substrate bonded in a subsequent step, and thus, it may be necessary to appropriately select an optimal value. Preferably, the region is larger than a width of the pad electrode 12 and there should be an interval of 10 μm or more inwardly from the region in which the sealing resin layer 13 is to be removed. When the region is formed exactly to the region in which the sealing resin layer is to be removed, a defective condition may be encountered in the case where the sealing resin squeezes out in the subsequent step for bonding the package substrate.

Figure 4A:
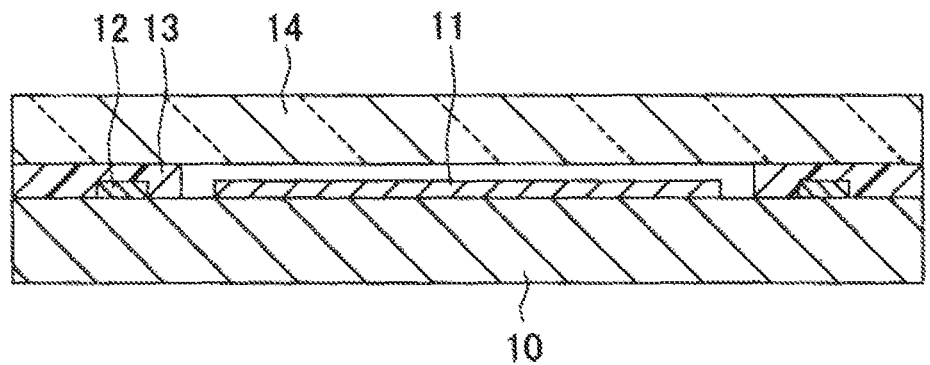
FIGS. 4A and 4B are cross-sectional views each showing the manufacturing step of the method of manufacturing the semiconductor device according to the first embodiment of the present invention.

Subsequently, as shown in FIG. 4A, for example, the package substrate 14 formed of a transparent substrate such as glass is disposed on the sealing resin layer 13 in a manner to face the active surface of the semiconductor substrate 10, and the solid-state imag sensor 11 is air-tightly sealed by the package substrate 14 and the sealing resin layer 13.

The sealing resin layer 13 is configured such that a portion for covering the pad electrode 12 and that for air-tightly sealing the package substrate 14 formed of the transparent substrate such as glass are formed of a single sealing resin layer. However, the sealing resin layer may be formed of a plurality of sealing resin materials.

Figure 4B:
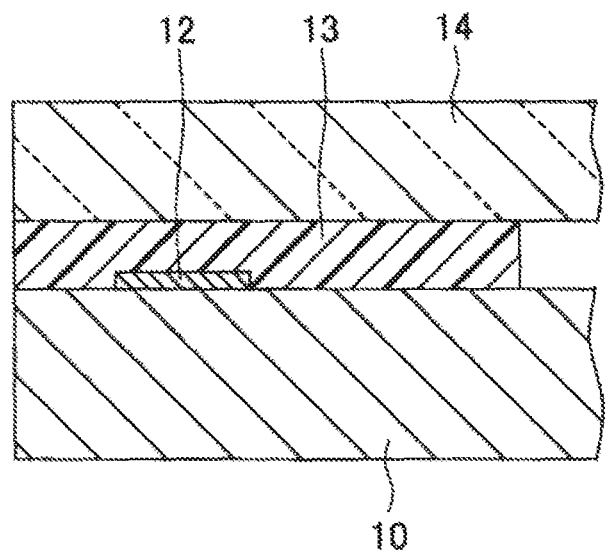

FIG. 4B is an enlarged view of essential parts of FIG. 4A, and steps that follow are described by the enlarged view.

Figure 5A:
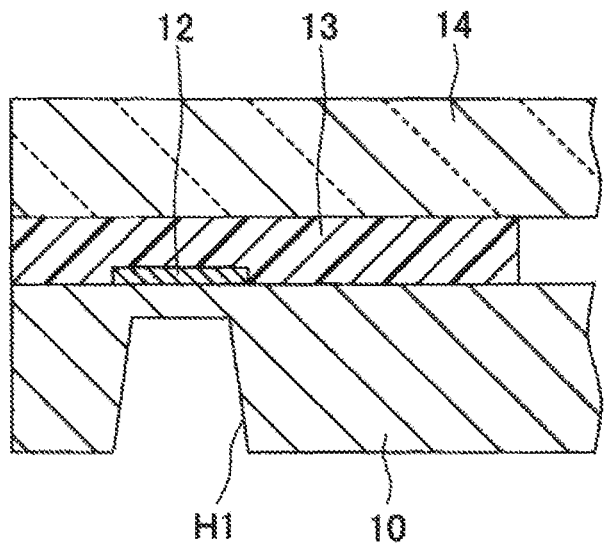
FIGS. 5A and 5B are cross-sectional views each showing the manufacturing step of the method of manufacturing the semiconductor device according to the first embodiment of the present invention.

Subsequently, as shown in FIG. 5A, for example, on a surface on a side opposite to the active surface of the semiconductor substrate 10, a resist film (not shown) of a pattern which opens the first opening is formed by a photolithography step, and an anisotropic dry etching process such as RIE (reactive ion etching) is applied to form the first opening H1 which extend from the second surface of the semiconductor substrate 10 toward the pad electrode 12.

Herein, a depth of the first opening H1 preferably is 0.5 times or more and 0.9 times or less a thickness of the semiconductor substrate 10.

Figure 5B:
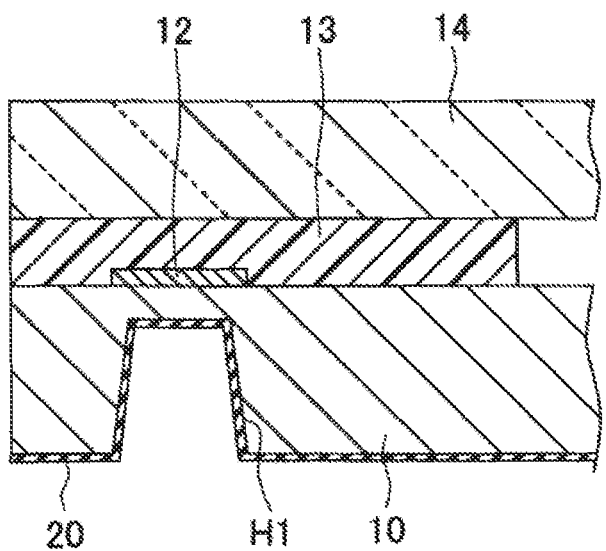

Subsequently, as shown in FIG. 5B, by a CVD (chemical vapor deposition) method, for example, the sidewall surface of the first opening H1 and the bottom surface thereof are covered to deposit oxide silicon of several 100 nm to several μmin film thickness, whereby the insulating layer 20 is formed.

Figure 6A:
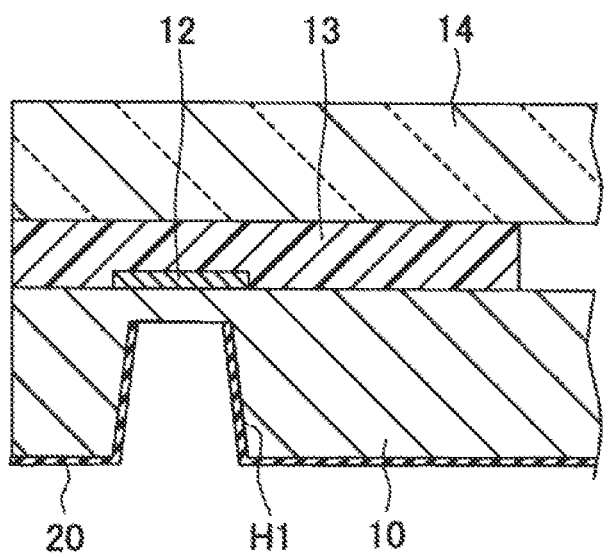
FIGS. 6A and 6B are cross-sectional views each showing the manufacturing step of the method of manufacturing the semiconductor device according to the first embodiment of the present invention.

Subsequently, as shown in FIG. 6A, a resist film (not shown) of a pattern which opens a bottom surface portion of the first opening is formed by a photolithography step, for example, and the anisotropic dry etching process such as RIE is applied to remove the insulating layer in the bottom surface portion of the first opening H1.

Figure 6B:
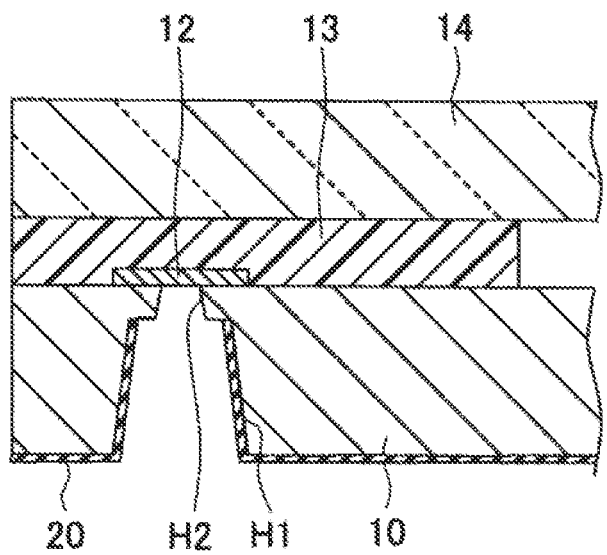

Subsequently, as shown in FIG. 6B, for example, a fourth harmonic frequency (266 nm) of a YAG laser or a laser beam such as an ArF excimer laser is irradiated to form the second opening H2 smaller in diameter than the first opening H1 to reach the pad electrode 12 from the bottom surface of the first opening H1.

For example, the use of the fourth harmonic frequency (266 nm) of the YAG laser may permit the formation of an opening of which diameter is 10 μm or less.

Herein, a diameter of the second opening H2 preferably is 0.7 times or less that of the first opening H1, and more preferably is 0.5 times or less.

Judging from a preferable range of the depth of the first opening H1, a preferable range of the depth of the second opening preferably is 0.1 times or more as large as a thickness of the semiconductor substrate 10 and 0.5 times or less as small as that. In particular, there is a processing variation of 3% to 5% within a wafer surface in an opening step of the first opening H1, and therefore, in the case where the thickness of the semiconductor substrate is 200 μm, for example, a margin of about 10 μm may be necessary, and thus, the depth of the second opening H2 preferably is 10 μm or more.

Figure 7A:
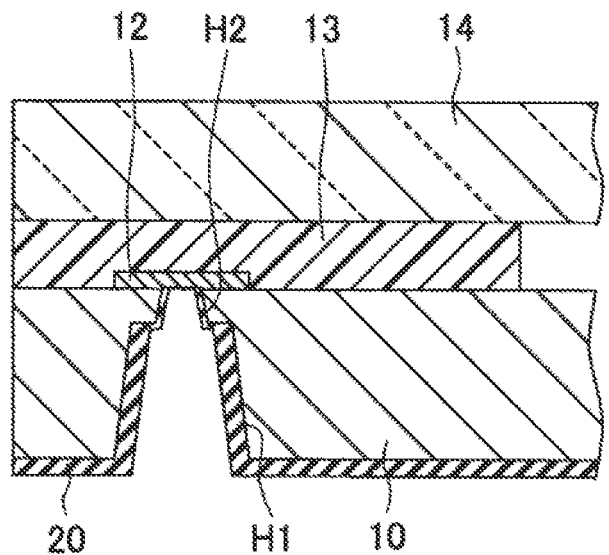
FIGS. 7A and 7B are cross-sectional views each showing the manufacturing step of the method of manufacturing the semiconductor device according to the first embodiment of the present invention.

Subsequently, as shown in FIG. 7A, according to a CVD method, for example, an oxide silicon film is formed in the portion of the sidewall surface of the second opening H2 to form the insulating layer 20, and the insulating layer 20 is rendered thick in film in the portion of the first opening H1.

As a result of the above-described steps, it may become possible to form, as the insulating layer 20, a portion which covers the sidewall surface of the first opening H1 is rendered thicker than that which covers the sidewall surface of the second opening H2.

Figure 7B:
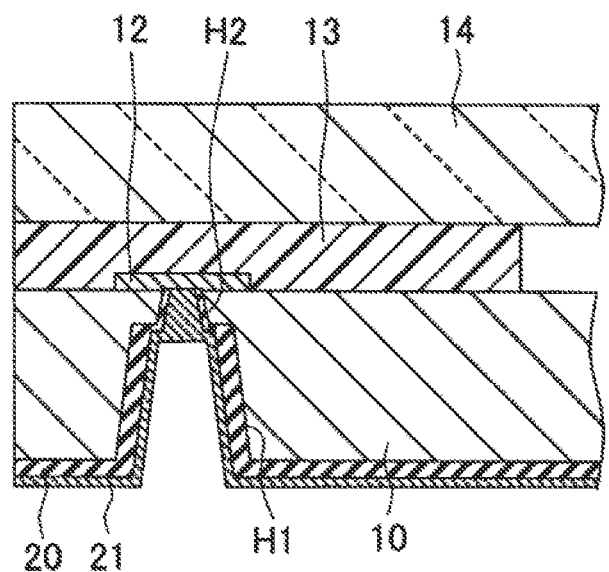

Thereafter, as shown in FIG. 7B, for example, at least the inner wall surface of the insulating layer 20 and the bottom surface of the second opening H2 are covered inside of the insulating layer 20 by the formation of a seed layer formed of copper by sputtering and a copper electrolytic plating process or the like, whereby the conductive layer 21 formed of copper is formed.

Figure 8A:
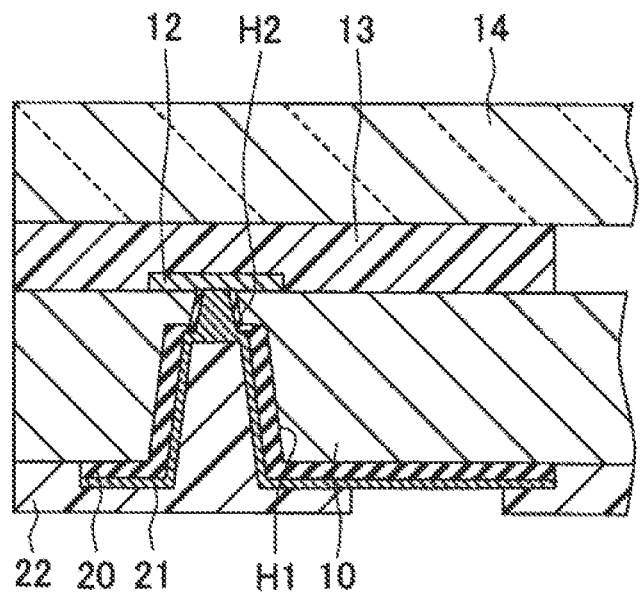
FIGS. 8A and 8B are cross-sectional views each showing the manufacturing step of the method of manufacturing the semiconductor device according to the first embodiment of the present invention.

Subsequently, as shown in FIG. 8A, a resist film (not shown) of a predetermined pattern is formed by a photolithography step, for example, and through the anisotropic dry etching process such as RIE, the conductive layer 21 and the insulating layer 20 are patterned to form a lead electrode which is lead out the opening on the surface on the side opposite to the active surface of the semiconductor substrate 10.

Subsequently, the surface on the side opposite to the active surface of the semiconductor substrate 10 is covered to embed within the first opening H1 and the second opening H2, whereby the passivation film 22 such as a solder resist is formed. The passivation film 22 is formed with an opening for exposing the conductive layer 21 in a bump formation region.

With respect to the passivation film, a portion for embedding within the first opening H1 and the second opening H2 and that for covering the surface on the side opposite to the active surface of the semiconductor substrate 10 are formed by an identical insulating material, but may be formed by insulating materials different to each other.

Figure 8B:
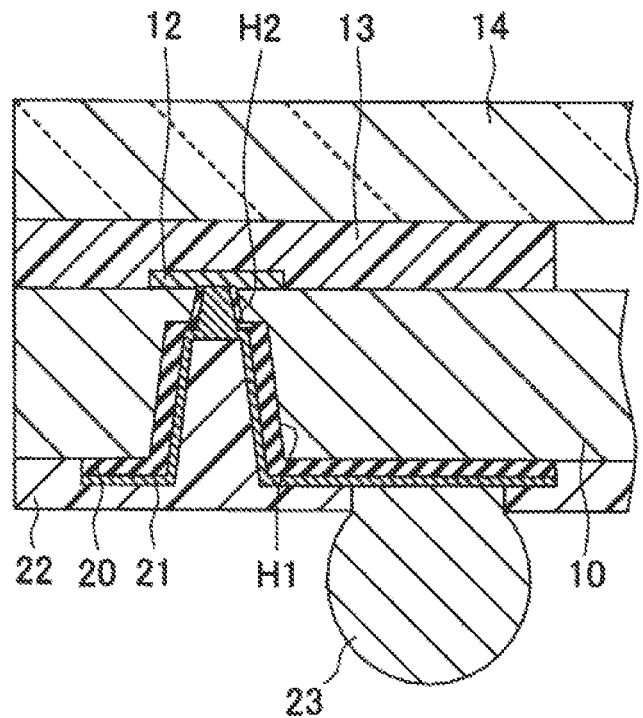

Subsequently, as shown in FIG. 8B, a bump 23 such as a solder ball bump, a gold stud bump is formed in the opening of the passivation film 22, for example.

As described above, the semiconductor device according to an embodiment of the present invention is formed.

As a step which follows the above-described steps, in the case where the above-described steps are performed on a wafer level, a dicing process is performed the singulation.

According to the method of manufacturing the semiconductor device of an embodiment of the present invention, when the first opening and the second opening smaller in diameter than the first opening are formed as the through hole, it may prevent crack or peeling generated due to a difference in thermal expansion coefficient between the conductive layer filled within the through hole and the substrate or the pad electrode.

Recently, a less power consumption and a higher speed of the semiconductor device are further desired, and a reduction in parasitic capacitance of the conductive layer filled within the through hole is also desired. With respect to a lower capacitance of the conductive layer within the through hole, when the conductive material layer formed on the sidewall of the through hole and the insulating layer formed between the silicon substrates are formed thickly, it may realize the conductive material layer with a lower capacitance. In forming an insulating material (oxide silicon, for example) for ensuring insulation from silicon, a CVD method or the like is generally employed to keep uniformity of the coverage. However, when in a shape of the through hole of the developing technologies of which diameter is in a tapering shape, if the insulating layer is rendered thick, an embedding property of the conductive layer is deteriorated in the vicinity of a bottom portion of the opening, and on the other hand, if the insulating layer is rendered thick to achieve a lower capacitance, it is time-consuming, thereby arising issue in that the TAT becomes lengthy.

In the semiconductor device of an embodiment of the present invention, however, the insulating film is formed twice, and thus, the thickness of the insulating film may be easily rendered thick. Further, only the first opening large in diameter is rendered thick, and thus, the insulating film is formed thinly in the second opening, whereby deterioration of the embedding property of the conductive layer can be prevented.

Alternatively, when a scratching by the probe left in the pad electrode at the time of an inspection overlaps with the formation region of the through hole, a defective condition such as pad corrosion may be generated.

Figure 9A:
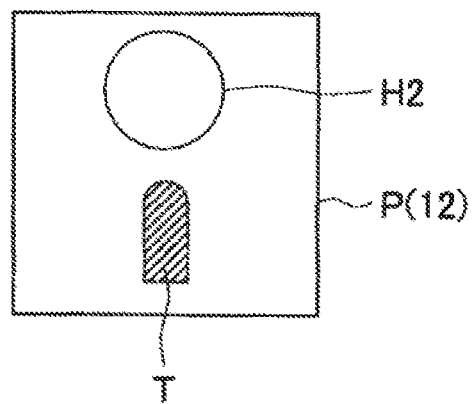
FIG. 9A is a layout chart showing a scratching by the probe and an opening region of a second opening in a pad electrode of the semiconductor of the first embodiment of the present invention.

FIG. 9A is a layout chart showing a scratching by the probe and an opening region of the second opening in the pad electrode. On a pad electrode P, a scratching by the probe T and the opening region of the second opening H2 are laid out so as not to overlap with each other.

In the method of manufacturing the semiconductor device of an embodiment of the present invention, the second opening which reaches the pad electrode is formed in practical by a laser irradiation, and thus, the second opening may be formed with highly precise positioning. As a result, a misalignment may be reduced, and thereby, as shown in FIG. 9A, the through hole may be formed by keeping away from a scratching by the probe.

Further, with respect to shrinking a size of the through hole, a bonding pad is contacted from the bottom surface of a device by forming the through hole, and therefore, in view of alignment precision, misalignment of the through hole or the like occurs, and thus, it may decrease a yield of a whole of a wafer. Thus, it is difficult to achieve shrinking of a size of the bonding pad, which results in a disadvantage to miniaturization of a device size.

Figure 9B:
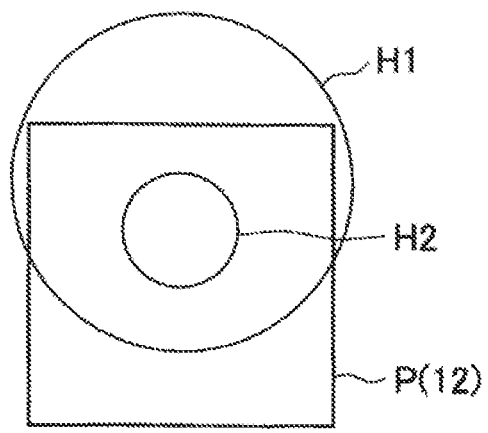
FIG. 9B is a layout chart of a first opening and the second opening relative to the pad electrode.

FIG. 9B is a layout chart showing the first opening and the second opening relative to the pad electrode.

In the method of manufacturing the semiconductor device of an embodiment of the present invention, the second opening which reaches the pad electrode is formed practically by a laser irradiation, and thus, misalignment may be reduced. Even if the first opening H1 is misaligned relative to the pad electrode P, as shown in FIG. 9B, the second opening H2 may be precisely formed in the event that there is a certain level of overlapping between the first opening H1 and the pad electrode P, thereby reducing a size of the pad electrode. Therefore, miniaturization of the device may be realized.

Second Embodiment

Figure 10:
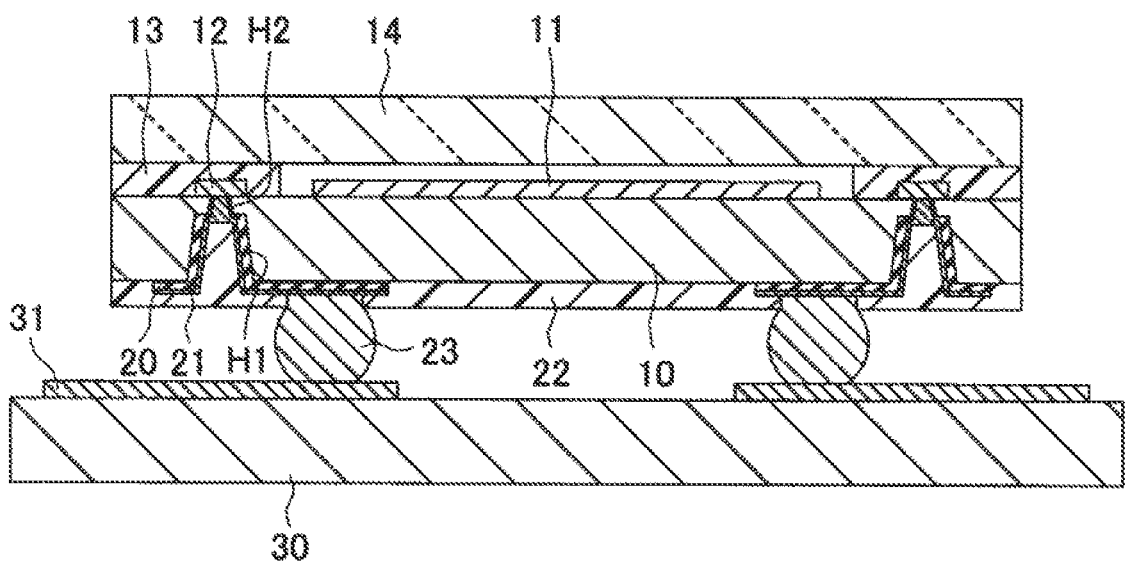
FIG. 10 is a schematic cross-sectional view of a semiconductor device according to a second embodiment of the present invention.

FIG. 10 is a cross-sectional view of a semiconductor device according to an embodiment of the present invention.

The semiconductor device according to the first embodiment is mounted via the bump 23 on a wiring 31 on another substrate 30 formed with a memory element or the like, whereby a module is realized. For example, this is mounted on a mounting substrate for use.

In addition, the semiconductor device according to the first embodiment may be used by being mounted on various mounting substrates and semiconductor substrates or the like.

The semiconductor device of embodiments of an embodiment of the present invention is configured by a first opening and a second opening smaller in diameter than the first opening as a through hole. Thus, it may become possible to prevent crack or peeling generated due to a difference in coefficient of thermal expansion between a conductive layer filled within the through hole and a substrate or a pad electrode.

A method of manufacturing a semiconductor device of an embodiment of the present invention, a first opening and a second opening smaller in diameter than the first opening are formed as a through hole, and thus, it may become possible to prevent crack or peeling generated due to a difference in coefficient of thermal expansion between a conductive layer filled within the through hole and a substrate or a pad electrode.

According to the semiconductor device according to each embodiment of the present invention, the following advantageous effects may be enjoyed:

As described above, in the semiconductor device of the embodiments, when the diameter of the opening (second opening) which contacts the pad electrode is rendered small, influence of a thermal expansion of the conductive layer formed in the opening may be reduced. As a result, a high reliability may be achieved.

The first opening lager in diameter is formed except for a portion which contacts the pad electrode, and as a result, the TAT of the formation of the through hole may be shortened, and even a thick wafer may be applied. Therefore, improvement of a handling ability may also be achieved.

Further, the pad electrode is contacted by the second opening smaller in diameter, and thus, a degree of freedom of position matching (alignment) of the through hole and the pad electrode is improved. As a result, the through hole may be formed keeping away from the scratching by the probe at the time of the inspection of a semiconductor wafer, whereby a yield of the through hole may be improved.

In addition, when the second opening smaller in diameter is formed, miniaturization of the pad electrode also may be achieved.

The insulating layer is formed on the wall surface of the first opening more thickly as compared to the second opening, and thus, a parasitic capacitance between the conductive layer inside of the opening and the semiconductor substrate may be reduced.

The present invention is not limited to the above-described description.

For example, the present invention may be applied not only to the semiconductor device which is packaged by air-tightly sealing a solid-state imaging device such as a CMOS image sensor, but also applied to a semiconductor device in which another electronic element is air-tightly sealed.

The present invention is not limited to a semiconductor device in a mode in which the electronic element is air-tightly sealed, but as long as a wiring which passes through a substrate is provided, the present invention may be applied.

In addition, the present invention may be modified in various ways so as long as not to depart from a gist of the present invention.

The semiconductor device of the present invention may be applied to a semiconductor device having a wiring which passes through a substrate such as a semiconductor device in a packaged form in which a solid-state imaging device or the like is air-tightly sealed.

The method of manufacturing the semiconductor device of the present invention may be applied to a method of manufacturing a semiconductor device having a wiring which passes through a substrate such as a semiconductor device in a packaged form in which a solid-state imaging device or the like is air-tightly sealed.

What is claimed is:

1. A device, comprising:
    a semiconductor substrate including an image sensor on a first surface of the semiconductor substrate, the semiconductor substrate including an opening at a peripheral region of the semiconductor substrate, the peripheral region being outside the image sensor;

a pad electrode disposed on the first surface of the semiconductor substrate and electrically connected with the image sensor;

a conductor disposed in the opening formed at the peripheral region of the semiconductor substrate and electrically connected to the pad electrode;

a passivation film on a second surface of the semiconductor substrate opposite to the first surface of the semiconductor substrate; and an insulating layer disposed in the opening and between the conductor and the semiconductor substrate, wherein a first edge of a first end of the conductor and a second edge of a second end of the conductor are covered by the passivation film, and wherein a first edge of a first end of the insulating layer and a second edge of a second end of the insulating layer are covered by the passivation film.

2. The device of claim 1, wherein the opening includes a first tapered portion and a second tapered portion, wherein the second tapered portion of the opening is closer to the pad electrode than the first tapered portion of the opening, wherein a largest diameter of the second tapered portion of the opening is smaller than a smallest diameter of the first tapered portion of the opening, wherein the insulating layer contacts the semiconductor substrate in the second tapered portion of the opening, and wherein a thickness of the insulating layer in the second tapered portion of the opening is different than a thickness of the insulating layer in the first tapered portion of the opening.

3. The device of claim 2, wherein the first tapered portion of the opening includes a first section of the semiconductor substrate that tapers toward the first surface of the semiconductor substrate, wherein the second tapered portion of the opening includes a second section of the semiconductor substrate that tapers toward the first surface of the semiconductor substrate, and wherein a third section of the semiconductor substrate connects the first section and the second section so that i) a first intersection of the first section and the third section forms a first obtuse angle that faces toward the opening, and ii) a second intersection of the second section and the third section forms a second obtuse angle that faces away from the opening.

4. The device of claim 3, wherein the conductor includes a first conductor portion with a first thickness in the first tapered portion of the opening, and a second conductor portion with a second thickness in the second tapered portion of the opening, wherein a depth of the first tapered portion of the opening is greater than a depth of the second tapered portion of the opening, and wherein the first thickness of the first conductor portion is less than the second thickness of the second conductor portion.

5. The device of claim 2, further comprising:

a transparent substrate disposed over the first surface of the semiconductor substrate via an adhesive layer disposed between the transparent substrate and at least the peripheral region of the semiconductor substrate, wherein the thickness of the insulating layer in the second tapered portion of the opening is constant, and wherein the thickness of the insulating layer in the first tapered portion of the opening is constant.

6. The device of claim 5, wherein the transparent substrate and the adhesive layer seal the image sensor.

7. The device of claim 4, wherein the first section of the semiconductor substrate is longer than the second section of the semiconductor substrate, and wherein the second conductor portion extends into the first tapered portion of the opening.

8. The device of claim 2, wherein the insulating layer and the conductor fill the second tapered portion of the opening, and wherein a depth of the first tapered portion of the opening is 0.5 times or more and 0.9 times or less than a thickness of the semiconductor substrate.

9. The device of claim 2, wherein the pad electrode is covered by a resin layer.

10. The device of claim 5, wherein the thickness of the insulating layer in the second tapered portion of the opening is thinner than the thickness of the insulating layer in the first tapered portion of the opening.

11. An apparatus, comprising:

a package including:

a semiconductor substrate including an image sensor on a first surface of the semiconductor substrate, the semiconductor substrate including an opening at a peripheral region of the semiconductor substrate, the peripheral region being outside the image sensor;

a pad electrode disposed on the first surface of the semiconductor substrate and electrically connected with the image sensor;

a conductor disposed in the opening formed at the peripheral region of the semiconductor substrate and electrically connected to the pad electrode;

a passivation film on a second surface of the semiconductor substrate opposite to the first surface of the semiconductor substrate; and an insulating layer disposed in the opening and between the conductor and the semiconductor substrate, wherein a first edge of a first end of the conductor and a second edge of a second end of the conductor are covered by the passivation film, and wherein a first edge of a first end of the insulating layer and a second edge of a second end of the insulating layer are covered by the passivation film.

12. The apparatus of claim 11, wherein the opening includes a first tapered portion and a second tapered portion, wherein the second tapered portion of the opening is closer to the pad electrode than the first tapered portion of the opening, wherein a largest diameter of the second tapered portion of the opening is smaller than a smallest diameter of the first tapered portion of the opening, wherein the insulating layer contacts the semiconductor substrate in the second tapered portion of the opening, and wherein a thickness of the insulating layer in the second tapered portion of the opening is different than a thickness of the insulating layer in the first tapered portion of the opening.

13. The apparatus of claim 12, wherein the first tapered portion of the opening includes a first section of the semiconductor substrate that tapers toward the first surface of the semiconductor substrate, wherein the second tapered portion of the opening includes a second section of the semiconductor substrate that tapers toward the first surface of the semiconductor substrate, and wherein a third section of the semiconductor substrate connects the first section and the second section so that i) a first intersection of the first section and the third section forms a first obtuse angle that faces toward the opening, and ii) a second intersection of the second section and the third section forms a second obtuse angle that faces away from the opening.

14. The apparatus of claim 13, wherein the conductor includes a first conductor portion with a first thickness in the first tapered portion of the opening, and a second conductor portion with a second thickness in the second tapered portion of the opening, wherein a depth of the first tapered portion of the opening is greater than a depth of the second tapered portion of the opening, and wherein the first thickness of the first conductor portion is less than the second thickness of the second conductor portion.

15. The apparatus of claim 12, further comprising:
a transparent substrate disposed over the first surface of the semiconductor substrate via an adhesive layer disposed between the transparent substrate and at least the peripheral region of the semiconductor substrate, wherein the thickness of the insulating layer in the second tapered portion of the opening is constant, and wherein the thickness of the insulating layer in the first tapered portion of the opening is constant.

16. The apparatus of claim 15, wherein the transparent substrate and the adhesive layer seal the image sensor.

17. The apparatus of claim 14, wherein the first section of the semiconductor substrate is longer than the second section of the semiconductor substrate, and wherein the second conductor portion extends into the first tapered portion of the opening.

18. The apparatus of claim 12, wherein the insulating layer and the conductor fill the second tapered portion of the opening, and wherein a depth of the first tapered portion of the opening is 0.5 times or more and 0.9 times or less than a thickness of the semiconductor substrate.

19. The apparatus of claim 12, wherein the pad electrode is covered by a resin layer.

20. The apparatus of claim 15, wherein the thickness of the insulating layer in the second tapered portion of the opening is thinner than the thickness of the insulating layer in the first tapered portion of the opening.

\* \* \* \* \*